(12) United States Patent
Matsuo et al.

(10) Patent No.: US 9,553,064 B2
(45) Date of Patent: Jan. 24, 2017

(54) ELECTRONIC DEVICE, AND MANUFACTURING METHOD OF ELECTRONIC DEVICE

(71) Applicant: SEIKO EPSON CORPORATION, Tokyo (JP)

(72) Inventors: Yoshihide Matsuo, Chino (JP); Masashi Yoshiike, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 15/054,413

(22) Filed: Feb. 26, 2016

(65) Prior Publication Data

US 2016/0276300 A1 Sep. 22, 2016

(30) Foreign Application Priority Data

Mar. 20, 2015 (JP) .................. 2015-057122

(51) Int. Cl.
*B41J 2/14* (2006.01)
*H01L 23/00* (2006.01)

(52) U.S. Cl.
CPC ............... *H01L 24/13* (2013.01); *H01L 24/11* (2013.01); *H01L 24/81* (2013.01); *H01L 2224/1319* (2013.01); *H01L 2224/13644* (2013.01)

(58) Field of Classification Search
CPC ............... H01L 2224/2919; H01L 2924/0665; H01L 2224/05644; H01L 2224/13144; H01L 2924/1461; H01L 2224/02166; H01L 31/0224; H01L 2224/45144; H01L 2224/48644; H01L 21/48; H01L 21/4817; H01L 21/4828; H01L 2224/13644; B41J 2/14201; B41J 2/1607; B41J 2/1623; B41J 2002/14411

See application file for complete search history.

(56) References Cited

U.S. PATENT DOCUMENTS

| | | | |
|---|---|---|---|
| 7,461,451 B2* | 12/2008 | Igarashi | B41J 2/1404 29/611 |
| 9,090,063 B2 | 7/2015 | Torimoto et al. | |
| 2014/0092173 A1* | 4/2014 | Kitamura | B41J 2/055 347/50 |

FOREIGN PATENT DOCUMENTS

| | | |
|---|---|---|
| JP | 2011-63760 A | 3/2011 |
| JP | 2014-34114 A | 2/2014 |

* cited by examiner

*Primary Examiner* — Roy Potter
(74) *Attorney, Agent, or Firm* — Workman Nydegger

(57) ABSTRACT

An electronic device includes a drive substrate (a pressure chamber substrate and a vibration plate) including a piezoelectric element and electrode wirings related to driving of the piezoelectric element formed thereon, and a sealing plate bonded thereto, the electrode wirings are made of wiring metal containing gold (Au) on the drive substrate through an adhesion layer which is a base layer, and has a removed portion in which a portion of the wiring metal in a region containing a part bonded to a bonding resin is removed and the adhesion layer is exposed.

7 Claims, 9 Drawing Sheets

ELECTRONIC DEVICE, AND MANUFACTURING METHOD OF ELECTRONIC DEVICE

BACKGROUND

1. Technical Field

The present invention relates to an electronic device, and a manufacturing method of an electronic device, in which a stacked body is bonded to a drive substrate including a drive element and a wiring related to driving of the drive element formed therein.

2. Related Art

An electronic device includes a drive element such as a piezoelectric element that is deformed in response to an applied voltage, and the electronic device is applied to various types of devices, sensors, or the like. For example, a liquid ejecting apparatus ejects various types of liquid from a liquid ejecting head using the electronic device. Examples of the liquid ejecting apparatus include an image recording apparatus such as an ink jet printer and an ink jet plotter, but in recent years, the liquid ejecting apparatuses has also been applied to various manufacturing apparatus, by taking advantage of features that a very small amount of liquid can be accurately landed at a predetermined position. For example, the liquid ejecting apparatus has been applied to a display manufacturing apparatus that manufactures a color filter for a liquid crystal display, or the like, an electrode forming apparatus that forms electrodes in an organic electro luminescence (EL) display, a field emission display (FED), or the like, and a chip manufacturing apparatus that manufactures a bio-chip (a biochemical element). Then, a recording head for the image recording apparatus ejects liquid ink, and a color material ejecting head for the display manufacturing apparatus ejects respective color material solutions of Red (R), Green (G), and Blue (B). Further, an electrode material ejecting head for the electrode forming apparatus ejects liquid electrode materials, and a bio-organic material ejecting head for the chip manufacturing apparatus ejects a bio-organic material solution.

The liquid ejecting head includes an electronic device in which a flow path substrate including a pressure chamber formed thereon in communication with a nozzle, a piezoelectric element (a type of a drive element) causing a pressure fluctuation in liquid inside the pressure chamber, a sealing plate (or also referred to as a protection substrate) provided and spaced from the piezoelectric element, and the like are stacked. In recent years, a technique of providing a drive circuit related to the driving of an actuator such as a piezoelectric element on a sealing plate has also been developed. Then, a technique is proposed in which this substrates are bonded with each other by adhesive (adhesive resin) made of photosensitive resin in a state where there is a space therebetween. In addition, a structure is adopted in which substrates are stacked by a photosensitive resin in order to correspond to the high density and miniaturization of a wiring, in a semiconductor package of a micro electro mechanical systems (MEMS) such as various sensors. Moreover, since there is a need for such high accuracy and low power consumption, in addition to the miniaturization of the package in this type of MEMS, gold (Au) having a low electric resistance for wirings related to driving of the drive circuit and having excellent ductility is preferably employed as a material. For example, in an ink jet printer which is disclosed in JP-A-2014-34114, gold is used as a wiring related to driving of a piezoelectric element which is a driving element. Then, a sealing plate is bonded to the substrate on which the piezoelectric element, the wiring, and the like are formed, through an adhesive.

However, there is a problem in that the adhesive strength caused by an adhesive becomes weak in the wiring portion, and the adhesive tends to be peeled off, when employing Au as a wiring in the configuration of bonding the substrates to each other by using an adhesive. In this regard, the configuration of JP-A-2014-34114 secures the adhesive strength by obtaining an effective bonding surface area by the adhesive at a portion other than the wiring. However, if the bonding strength in a wiring portion is weak, a bonding reliability is not sufficient, and in particular, a sufficient adhesive strength is not obtained in a configuration in which wiring is highly densified on the substrate and a large surface area is occupied.

SUMMARY

An advantage of some aspects of the invention is to provide an electronic device and a manufacturing method of an electronic device, which capable of further improving the adhesion reliability in a configuration of using gold or alloys for the wiring.

Aspect 1

According to an aspect of the invention, an electronic device includes a drive substrate including a drive element and a wiring related to driving of the drive element, which are formed thereon; and a stacked body that is formed and spaced from the drive substrate, by interposing the drive element, the wiring, and a bonding resin therebetween, in which the wiring is made of wiring metal containing gold (Au) on the drive substrate through a base layer, and a portion of the base layer is exposed by removing a portion of the wiring metal, and the exposed base layer includes a portion covered with the bonding resin, and a portion that is not covered with the bonding resin.

According to a configuration of Aspect 1, since the bonding resin is bonded to the base layer that is exposed by removing the wiring metal containing Au having inferior adhesiveness to the bonding resin, it is possible to further strengthen the bonding strength between the drive substrate and the stacked body, and it is possible to further improve the adhesion reliability. In particular, the present invention is suitable for a configuration in which a wiring made of wiring metal mainly composed of Au is formed at a higher density.

Aspect 2

Further, in the configuration of Aspect 1, it is preferable to adopt a configuration in which a wiring metal removal region, which is a portion of the base layer including portion covered with the bonding resin and a portion that is not covered with the bonding resin, is surrounded by the wiring metal in a plan view.

According to a configuration of Aspect 2, since the wiring metal removal region surrounds the wiring metal in a plan view, an increase in the electric resistance at this portion is suppressed, and thus it is possible to secure conduction.

Aspect 3

Further, in the configuration of Aspect 1 or Aspect 2, it is preferable to adopt a configuration in which a dimension in a wiring direction of the wiring metal removal region is greater than a width in the wiring direction of a portion in which the bonding resin is bonded to the base layer.

According to a configuration of Aspect 3, it is possible to more reliably bond the bonding resin and the base layer, by setting the dimension in the wiring direction of the wiring metal removal region to be larger than the width in the wiring direction of the portion in which the bonding resin is bonded to the base layer.

Aspect 4

Further, in the configuration of any one of Aspect 1 to Aspect 3, it is preferable to adopt a configuration in which the wiring metal removal region is subjected to a surface treatment by an organic molecule having a functional group that is chemically bonded to the bonding resin.

According to a configuration of Aspect 4, since the wiring metal removal region is subjected to a surface treatment, a bonded site per unit surface area of the portion increases, and thus it is possible to further increase the adhesive strength to the bonding resin.

Aspect 5

Further, in the configuration of any one of Aspect 1 to Aspect 4, it is preferable to adopt a configuration in which the bonding resin has an epoxy group, and the organic molecule has an amino group.

Aspect 6

Further, in the configuration of any one of Aspect 1 to Aspect 5, it is preferable to adopt a configuration in which the base layer is made of metal different from Au.

According to a configuration of Aspect 6, if the base layer is made of metal different from Au, the metal functions as wiring material as well as being capable of securing the bonding strength to the bonding resin, and thus it is possible to suppress the electrical resistance by securing conductivity.

Aspect 7

According to another aspect of the invention, a manufacturing method of an electronic device including a drive substrate including a drive element and a wiring related to driving of the drive element, which are formed thereon, and a stacked body that is formed and spaced from the drive substrate, by interposing the drive element, the wiring, and a bonding resin therebetween, the manufacturing method includes forming a base layer on the drive substrate; forming a wiring by superimposing and forming wiring metal containing gold (Au) on the base layer; exposing the base layer by removing a portion of the wiring metal; and bonding the drive substrate and the stacked body, in a state where a bonding resin is bonded to a portion in which the base layer is exposed, by interposing the bonding resin between the drive substrate and the stacked body.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the present invention will be described with reference to the accompanying drawings. Note that in the embodiments described below, various limits are presented as preferred specific embodiments of the invention, but the scope of the present invention is not limited to these embodiments, unless a particular description for limiting the invention is given in the following description. Further, in the following description, an ink jet printer (hereinafter, referred to as a printer) which is a type of a liquid ejecting apparatus equipped with an ink jet recording head (hereinafter, referred to as a recording head) which is a type of a liquid ejecting head provided with an electronic device according to the present invention will be described as an example.

Figure 1:
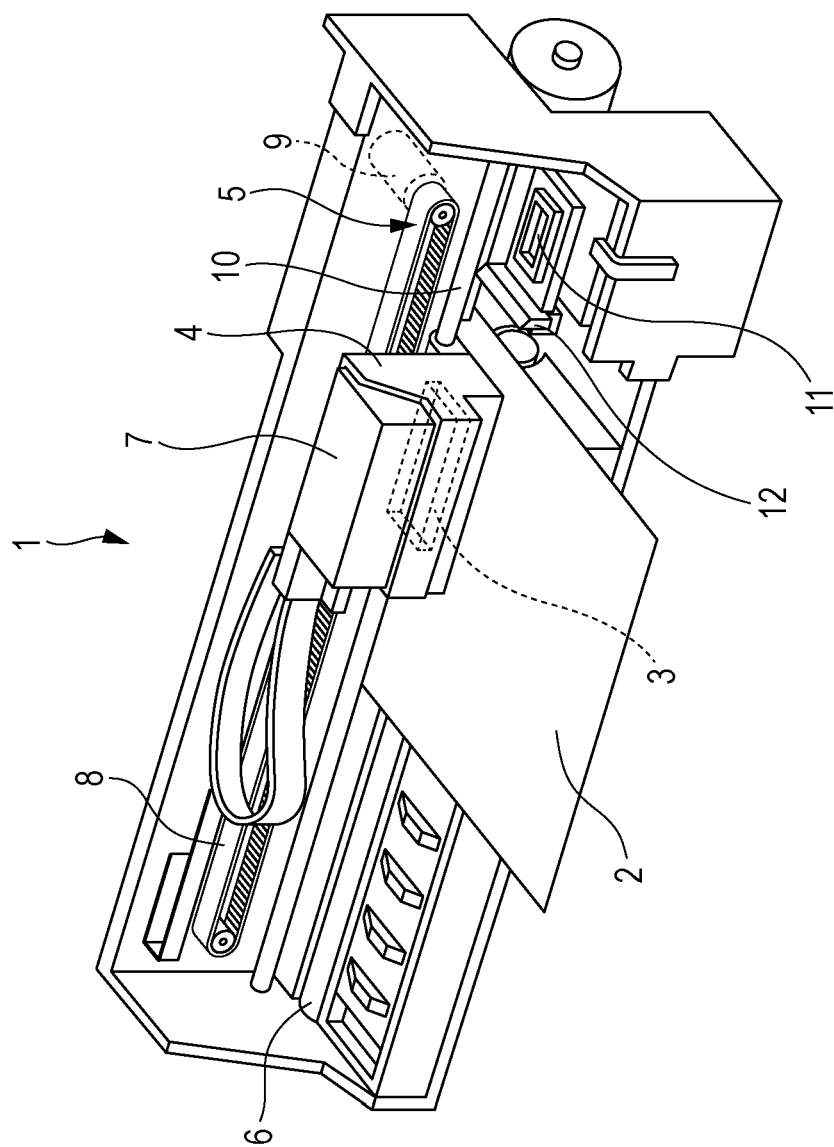
FIG. 1 is a perspective view illustrating a configuration of a printer.

The configuration of the printer 1 will be described with reference to FIG. 1. The printer 1 is an apparatus that records an image or the like by ejecting (discharging) and discharging ink (a type of liquid) on to the surface of the recording medium 2 such as a recording sheet. The printer 1 includes a recording head 3, a carriage 4 including the recording head 3 attached thereto, a carriage moving mechanism 5 that moves the carriage 4 in a main scanning direction, a transport mechanism 6 that transports the recording medium 2 in a sub-scanning direction, and the like. Here, the ink is retained in the ink cartridge 7 which is a liquid supply source. The ink cartridge 7 is detachably mounted on the recording head 3. In addition, a configuration can be employed in which an ink cartridge is disposed on the body side of a printer, and ink is supplied from the ink cartridge to a recording head through an ink supply tube.

The carriage moving mechanism 5 includes a timing belt 8. The timing belt 8 is driven by a pulse motor 9 such as a DC motor. Therefore, when the pulse motor 9 is operated, the carriage 4 is guided to a guide rod 10 that is installed in the printer 1, and reciprocates in the main scanning direction (in the width direction of the recording medium 2). The position of the carriage 4 in the main scanning direction is detected by a linear encoder (not illustrated). The linear encoder transmits the detection signal, that is, an encoder pulse to the control unit of the printer 1.

A home position that becomes a base point of the scanning of the carriage 4 is set further in the outer end region than the recording region within the moving range of the carriage 4. A cap 11 that seals a nozzle 22 that is formed on the nozzle surface (a nozzle plate 21) of the recording head 3, and a wiping unit 12 that wipes the nozzle surface are arranged in order from the end side in the home position.

Figure 2:
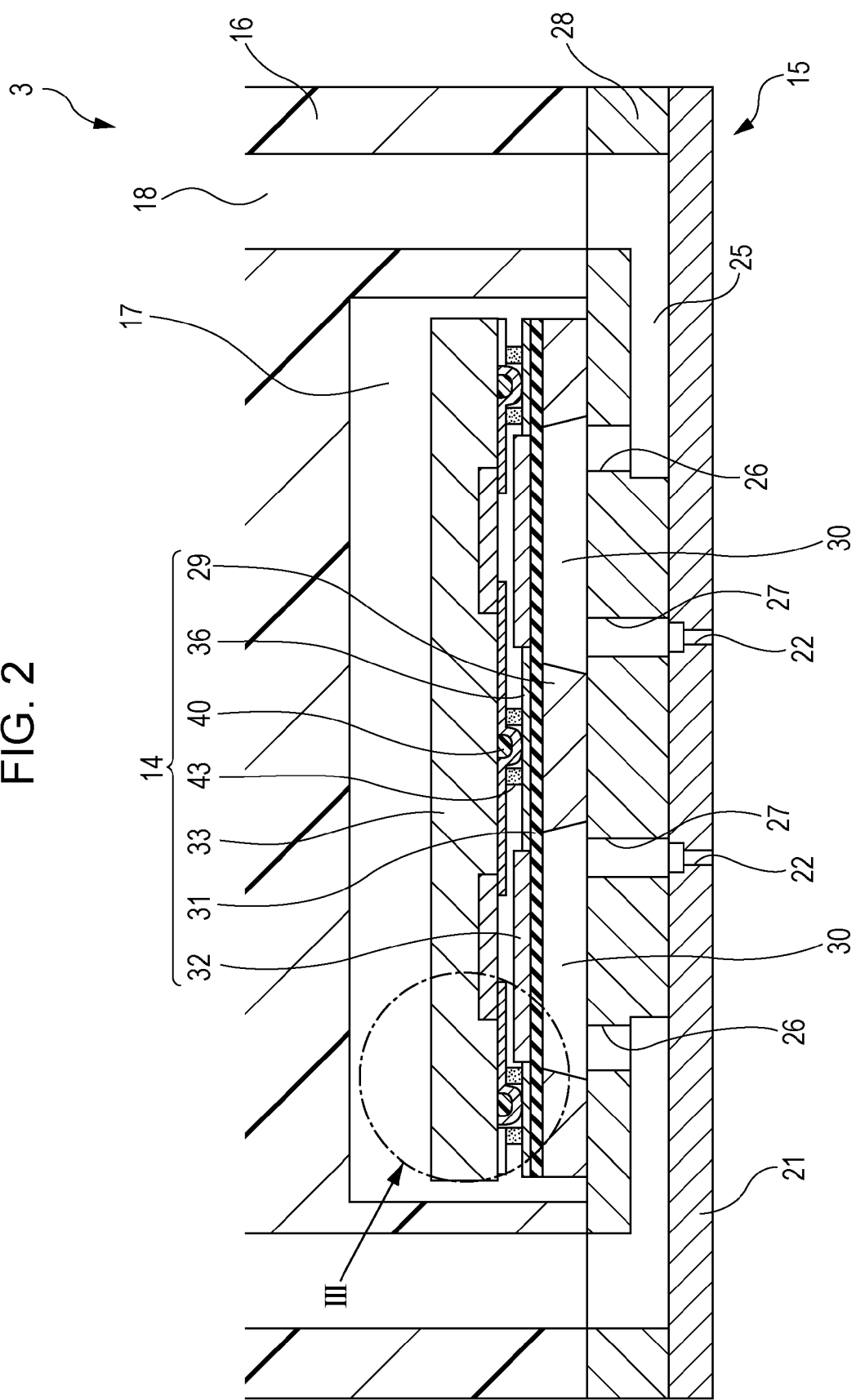
FIG. 2 is a cross-sectional view illustrating a configuration of a recording head.
Figure 3:
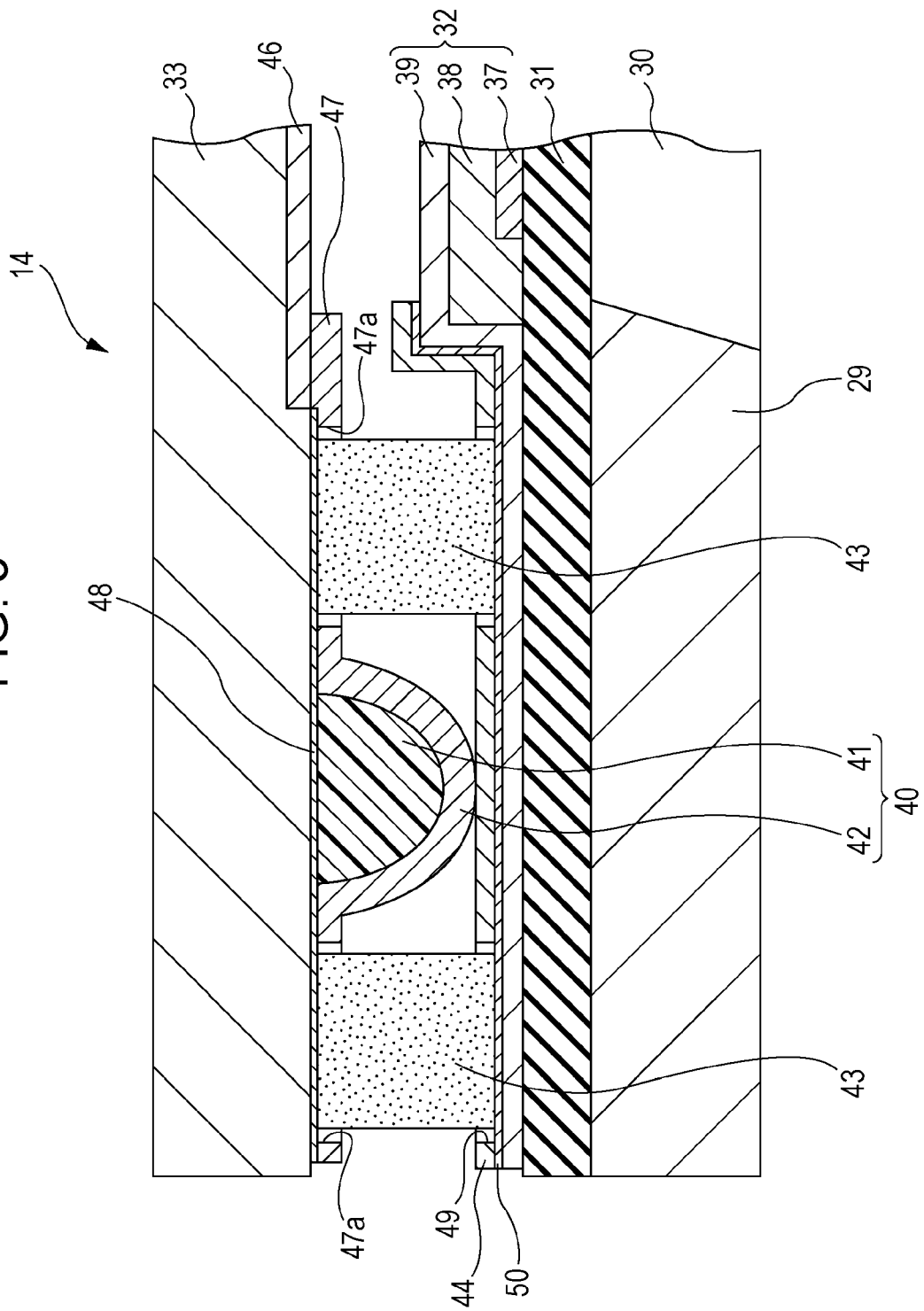
FIG. 3 is an enlarged cross-sectional view of a main portion of an electronic device.
Figure 4:
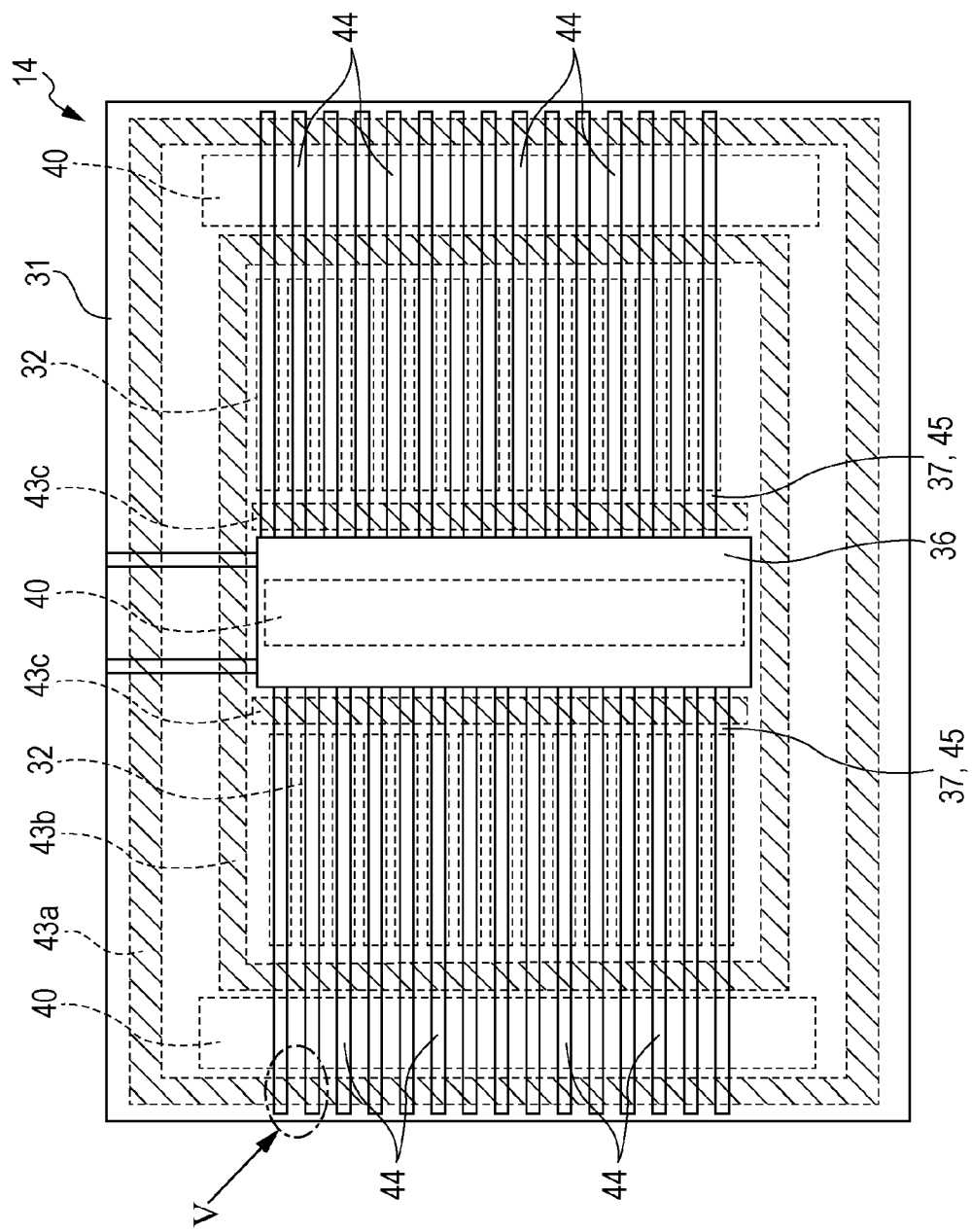
FIG. 4 is a plan view of a drive surface.
Figure 5:
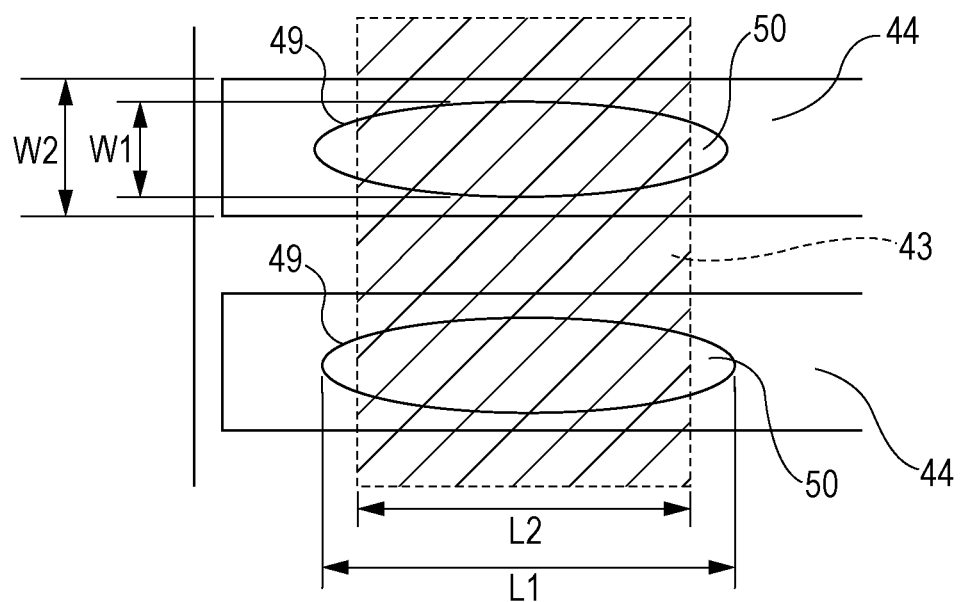
FIG. 5 is an enlarged view of a main portion of a wiring.

Next, the recording head 3 will be described. FIG. 2 is a cross-sectional view illustrating the configuration of the recording head 3. FIG. 3 is an enlarged view of a region III in FIG. 2, and is an enlarged cross-sectional view of a main portion of an electronic device 14 which is built into the recording head 3. FIG. 4 is a plan view illustrating the configuration of the recording head 3, and focuses on the configuration of the upper surface (a surface bonded with the sealing plate 33) of the vibration plate 31. FIG. 5 is an enlarged plan view of a region V in FIG. 4. As illustrated in FIG. 2, the recording head 3 in the present embodiment is attached to the head case 16 in a state where the electronic device 14 and the flow path unit 15 are stacked. It should be noted that, for the sake of convenience, the stacking direction of respective members will be described as a vertical direction.

The head case 16 is a box-shaped member made of synthetic resin, and includes a first reservoir 18 that supplies ink to each pressure chamber 30 formed therein. The first reservoir 18 is a space that stores ink common to a plurality of the pressure chambers 30 which are arranged in parallel, and is formed along the nozzle array direction. An ink introduction path (not illustrated) for introducing the ink from the ink cartridge 7 side to the first reservoir 18 is formed above the head case 16. An accommodating space 17, that is recessed in a rectangular parallelepiped shape from the lower surface to the middle, in the height direction of the head case 16, is formed on the lower surface side of the head case 16. It is configured that if a flow path unit 15 to be described later is bonded with the lower surface of the head case 16 in positioned state, the electronic device 14 (a pressure chamber substrate 29, a vibration plate 31, a sealing plate 33, and the like) that is stacked on the flow path substrate 28 is accommodated in the accommodating space 17.

The flow path unit 15 which is bonded to the lower surface of the head case 16 includes a flow path substrate 28 and a nozzle plate 21. The flow path substrate 28 in the present embodiment is made of a silicon single crystal substrate. As illustrated in FIG. 2, a second reservoir 25 which is in communication with the first reservoir 18 and stores ink common to the respective pressure chambers 30, and a separate communication path 26 that individually supplies ink from the first reservoir 18 to the respective pressure chambers 30 through the second reservoir 25 are formed by etching on the flow path substrate 28. The second reservoir 25 is an elongated hollow portion along the nozzle array direction (the arrangement direction of the pressure chamber 30). A plurality of separate communication paths 26 are formed along the arrangement direction of the pressure chamber 30, corresponding to each pressure chamber 30. The separate communication path 26 is in communication with one end in the longitudinal direction of the corresponding pressure chamber 30, in a state where the flow path substrate 28 and the pressure chamber substrate 29 are bonded.

Further, a nozzle communication path 27 passing through the flow path substrate 28 in the thickness direction is formed in a position on the flow path substrate 28 corresponding to each nozzle 22. In other words, a plurality of nozzle communication paths 27 are formed along the nozzle array direction, corresponding to the nozzle arrays. The pressure chamber 30 and the nozzle 22 are in communication with each other through the nozzle communication path 27. The nozzle communication path 27 of the present embodiment is in communication with the end on the other side (on the opposite side of the separate communication path 26) in the longitudinal direction of the corresponding pressure chamber 30.

The nozzle plate 21 is a substrate made of silicon or metal such as stainless steel that is bonded to the lower surface (the surface on the opposite side of the electronic device 14) of the flow path substrate 28. A plurality of nozzles 22 are provided in a row on the nozzle plate 21. A plurality of nozzles 22 (nozzle arrays) which are arranged in a row are provided along the sub-scanning direction perpendicular to the main scanning direction, at a pitch corresponding to the dot formation density, from the nozzle 22 on one side to the nozzle 22 on the other side. In the present embodiment, two sets of nozzle arrays are arranged in parallel on the nozzle plate 21. In the present embodiment, two sets of nozzle arrays are arranged in parallel on the nozzle plate 21.

The electronic device 14 of the present embodiment is a device formed by stacking thin plate-like components of which each functions as an actuator generating a pressure variation in the ink in each pressure chamber 30. As illustrated in FIGS. 2 and 3, the electronic device 14 is formed into a unit in which a pressure chamber substrate 29, a vibration plate 31, a piezoelectric element 32, and a sealing plate 33 are stacked. In addition, the electronic device 14 is formed smaller than the accommodating space 17 so as to be accommodated in the accommodating space 17.

The pressure chamber substrate 29 of the present embodiment is made of a silicon single crystal substrate. A portion of the pressure chamber substrate 29 is completely removed in the thickness direction by etching so as to form spaces to become the pressure chambers 30. A plurality of the spaces, that is, the pressure chambers 30 are arranged in parallel corresponding to the respective nozzles 22. Each pressure chambers 30 is an elongated hollow portion in a direction perpendicular to the nozzle array direction, and is in communication with the separate communication path 26 in one end in the longitudinal direction, and is in communication with the nozzle communication path 27 in the other end.

The vibration plate 31 is a thin film-like member having elasticity, and is stacked on the upper surface (the surface on the opposite side of the flow path substrate 28 side) of the pressure chamber substrate 29. The upper opening of the space which becomes the pressure chamber 30 is sealed by the vibration plate 31. In other words, the pressure chamber 30 is partitioned by the vibration plate 31. The portion corresponding to the pressure chamber 30 (specifically, the upper opening of the pressure chamber 30) in the vibration plate 31 functions as a displacement portion which is displaced in the direction away from the nozzle 22 or in the direction close thereto in accordance with the flexural deformation of the piezoelectric element 32. In other words, the region corresponding to the upper opening of the pressure chamber 30 in the vibration plate 31 becomes a drive region for which flexural deformation is allowed. Meanwhile, the region deviated from the upper opening of the pressure chamber 30 in the vibration plate 31 becomes a non-drive region for which flexural deformation is inhibited.

The vibration plate 31 is configured with, for example, an elastic film made of silicon dioxide ($SiO_2$) formed on the upper surface of the pressure chamber substrate 29, and an insulating film made of zirconium oxide ($ZrO_2$) formed on the elastic film. The piezoelectric elements 32 are respectively stacked on regions corresponding to the respective pressure chambers 30 on the insulating film (the surface on the opposite side of the pressure chamber substrate 29 side of the vibration plate 31), that is, drive regions. In addition, the pressure chamber substrate 29 and the vibration plate 31 stacked thereon correspond to the drive substrate of the present invention. Further, the surface of the vibration plate 31 on which the piezoelectric element 32 is formed is a bonding surface to which the sealing plate 33 is bonded.

The piezoelectric element 32 of the present embodiment is a so-called flexural mode piezoelectric element. As illustrated in FIG. 3, the piezoelectric element 32 is configured, for example, by sequentially stacking a lower electrode layer 37, a piezoelectric layer 38, and an upper electrode layer 39 on a vibration plate 31. In the present embodiment, the upper electrode layer 39 functions as an individual electrode for each piezoelectric element 32, and the lower electrode layer 37 functions as an electrode common to the respective piezoelectric elements 32. If an electric field corresponding to a potential difference between both electrodes is applied to between the lower electrode layer 37 and the upper electrode layer 39, the piezoelectric element 32 configured in this manner is subjected to flexural deformation in a direction away from the nozzle 22 or in a direction close thereto. A plurality of piezoelectric elements 32 are arranged in parallel in the nozzle array direction, corresponding to the respective nozzles 22, and as illustrated in FIG. 4, two piezoelectric element groups corresponding to two sets of nozzle arrays are formed respectively on the vibration plate 31 while having a common electrode film 36 to described later interposed therebetween.

Various types of metal such as iridium (Ir), platinum (Pt), titanium (Ti), tungsten (W), tantalum (Ta), and molybdenum (Mo), alloys thereof and the like are used as the upper electrode layer 39 and the lower electrode layer 37. Ferroelectric piezoelectric material such as lead zirconate titanate (PZT), or a relaxor ferroelectric containing metal such as niobium, nickel, magnesium, bismuth or yttrium added thereto is used as the piezoelectric layer 38. In addition, it is possible also to use non-lead material such as barium titanate.

As illustrated in FIG. 3, the end on the other side (the left side in FIG. 3, or the opposite side of the common electrode film 36 side in FIG. 4) of the upper electrode layer 39 extends to the vibration plate 31 corresponding to the non-drive region, across the upper opening edge of the pressure chamber 30. An individual electrode wiring 44 (corresponding to a wiring in the present invention) is stacked on the upper electrode layer 39, through the adhesion layer 50 (corresponding to the base layer in the present invention). The individual electrode wiring 44 and the adhesion layer 50 are patterned for each upper electrode layer 39 which is an individual electrode, and are conducted to respective corresponding upper electrode layers 39. Further, as illustrated in FIG. 4, similarly, the end on one side (the common electrode film 36 side in FIG. 4) of the lower electrode layer 37 extends from the drive region to the vibration plate 31 corresponding to a non-drive region on the opposite side of the non-drive region on which the upper electrode layer 39 is stacked, across the upper opening edge of the pressure chamber 30. The common electrode wiring 45 (corresponding to the wiring in the present invention) is stacked on the extended lower electrode layer 37, through the adhesion layer 50. The common electrode film 36 that functions as a terminal of the common electrode is formed in the center portion which is a region interposed in a piezoelectric element group of the vibration plate 31, and the common electrode film 45 is electrically connected to the common electrode film 36.

Gold (Au) or an Au alloy is used as the material of the individual electrode wiring 44 and the common electrode wiring 45 (wiring metal in the present invention). Metal other than gold, for example, titanium, nickel, chromium, or alloys thereof (without containing Au) is used as the adhesion layer 50. The adhesion layer 50 in this embodiment is made of nickel-chromium (NiCr). Then, the adhesion layer 50 also has electrical conductivity, and function as a part of the wiring material. Further, respectively corresponding bump electrodes 40 are electrically connected to the individual electrode wiring 44 and the common electrode wiring 45. The bump electrode 40 will be described later.

The sealing plate 33 (corresponding to the stacked body in the present invention) is a silicon-made plate member formed into a flat plate shape. As illustrated in FIG. 3, a drive circuit 46 related to the driving of each piezoelectric element 32 is formed in a region facing the piezoelectric element 32 of the sealing plate 33. The drive circuit 46 is formed on the surface of the silicon single crystal substrate which is the sealing plate 33, by using a semiconductor process (that is, a film formation process, a photolithography process, an etching process, and the like). Further, a wiring layer 47 connected to the drive circuit 46 is formed on the drive circuit 46 of the surface on the piezoelectric element 32 side of the sealing plate 33, in a state of being exposed to the surface on the vibration plate 31 side of the sealing plate 33, in other words, a surface bonded to the vibration plate 31, through the adhesion layer 48. The wiring layer 47 is made of Au in the similar manner to the electrode wirings 44 and 45 on the drive substrate side, and is routed to a position corresponding to the lower electrode layer 37 and the upper electrode layer 39 that extend to the non-drive region, which is an outer side than the drive circuit 46. The adhesion layer 48 is a base layer made of metal other than gold, such as NiCr in the similar manner as the adhesion layer 50. In addition, the wiring layer 47 is integrally illustrated in FIG. 3 for the sake of convenience, but includes a plurality of wirings. Specifically, the wiring layer 47 for the individual electrode wiring 44 (upper electrode layer 39) of the piezoelectric element 32, and the wiring layer 47 for the common electrode wiring 45 (lower electrode layer 37) of each piezoelectric element 32 are patterned on the surface of the sealing plate 33 through the adhesion layer 50. Each wiring layer 47 is electrically connected to the corresponding wiring terminal in the drive circuit 46.

A drive substrate configured with the pressure chamber substrate 29, on which the vibration plate 31 and the piezoelectric element 32 are stacked, and the sealing plate 33 on which a drive circuit related to the driving of the piezoelectric element 32 is provided are bonded by a bonding resin 43 having the bump electrode 40 interposed therebetween. The bonding resin 43 has a function as a spacer for ensuring an interval between the substrates, a function as sealing material for sealing a space that accommodates the piezoelectric element 32 and the like between the substrates, and a function of an adhesive for bonding the substrates to each other. For example, resins containing a photopolymerization initiator and the like, with epoxy resins, acrylic resins, phenolic resins, polyimide resins, silicone resins, styrene resins or the like as a main component, are preferably used as the bonding resin 43, and in this embodiment, those with the epoxy resins as a main component are employed. In the embodiment, as illustrated in FIG. 4, a first bonding resin 43a which is formed in a frame shape in a plan view along the outer edge of the vibration plate 31 and the sealing plate 33, and a second bonding resin 43b which is positioned in an inner side than the first bonding resin 43a is formed into a shape surrounding the piezoelectric element group. The vibration plate 31 and the sealing plate 33 are spaced by the bonding resins 43a and 43b which are formed double. The gap between the vibration plate 31 and the sealing plate 33 is set so as not to inhibit the strain deformation of the piezoelectric element 32. Further, a third bonding resin 43c is formed on the common electrode wiring 45 between the drive region of the piezoelectric element 32 and the common electrode film 36, which is an inner region of the second bonding resin 43b.

The bump electrode 40 is an electrode for connecting the drive circuit 46, the individual electrode wiring 44 (upper electrode layer 39) of each piezoelectric element 32, and the common electrode wiring 45 (lower electrode layer 37), and is arranged so as to come into contact with and be electrically connected to the individual electrode wiring 44 and the common electrode film 36 on the non-drive region, respectively. The bump electrode 40 includes an internal resin (resin core) 41 as a protrusion extending along the arrangement direction (nozzle array direction) of the pressure chamber, and a conductive film 42 which is partially formed on the surface of the internal resin 41. The internal resin 41 is made of, for example, a resin having elasticity such as a polyimide resin, and is formed in a total of three places: regions (right and left sides in FIG. 4) facing the non-drive region in which the individual electrode wiring 44 of the vibration plate 31 is formed, on the bonding surface of the sealing plate 33, and a region facing the central region in which the common electrode film 36 is formed. Further, the conductive films 42 is a part of the wiring layer 47, and is formed in a position facing the individual electrode wiring 44. Therefore, a plurality of conductive films 42 are formed along the nozzle array direction. Similarly, a plurality of conductive films 42 corresponding to the common electrode films 36 are formed along the nozzle array direction.

FIG. 5 is an enlarged view of a region V in FIG. 4. As illustrated in FIGS. 4 and 5, the bonding resin 43 is also bonded to the individual electrode wiring 44 and the common electrode wiring 45, or the wiring layer 47 of the sealing plate 33. However, since the surfaces of the electrode wirings 44 and 45 and the wiring layer 47 are Au, the bonding resin 43 is less likely to be bonded, and the adhesive strength of the bonding resin 43 is not sufficiently obtained. Therefore, in the electronic device 14 according to the present invention, as illustrated in FIG. 5, with respect to the individual electrode wiring 44 and the common electrode wiring 45, Au is removed in the portion bonded to the bonding resin 43 is removed, the adhesion layer 50 which is a base layer is exposed, and the bonding resin 43 is bonded to the exposed part, such that the adhesive strength is ensured. More specifically, removed portions 49 (corresponding to wiring metal removal regions in the present invention) are respectively formed on the electrode wirings 44 and 45, and each removed portion 49 is obtained by removing a portion of Au that is wiring metal of a region being slightly wider than a part to be bonded to the bonding resin 43, including the part, and by exposing the adhesion layer 50 which is the base layer. Similarly, a removed portion 47a, which is obtained by removing Au of a portion to be bonded to the bonding resin 43 and exposing the adhesion layer 48 which is the base layer, is also formed in the wiring layer 47 on the sealing plate 33 (see FIG. 3). Since the removed portion 47a of the wiring layer 47 has the same configuration as the removed portion 49 in the electrode wirings 44 and 45, the following description mainly focuses on the removed portion 49 of the electrode wirings 44 and 45 side.

The removed portion 49 in the present embodiment is a portion in which Au is hollowed out into an elliptical shape (outlined while leaving the periphery) in a plan view through etching. Further, a dimension (major diameter) L1 in a wiring direction (wiring arrangement direction) of the removed portion 49 is longer than a length L2 of a portion at which the bonding resin 43 is bonded to the adhesion layer 50, in the removed portion 49. In other words, the adhesion layer 50 which is exposed to the removed portion 49 includes a portion covered with the bonding resin 43 and a portion that is not covered with the bonding resin 43. Thus, it is possible to further secure the bonding region between the bonding resin 43 and the adhesion layer 50. Further, a dimension (minor diameter) W1 in a wiring direction of the removed portion 49 is greater than a width W2 of the electrode wirings 44 and 45. Therefore, the removed portion 49 is surrounded with Au. In other words, the electrode wirings 44 and 45 are continuous without being interrupted in a portion where the removed portion 49 is formed. Thus, a significant increase in the electric resistance in this portion is suppressed, and it is possible to secure conduction. The shape of the removed portion 49 is limited to the elliptical shape, and may be a rectangular shape or the like.

Next, a process of manufacturing the electronic device 14, in particular, a bonding process of the pressure chamber substrate 29 as a drive substrate on which the piezoelectric element 32 and the vibration plate 31 are stacked, and the sealing plate 33 as a stacked body will be described. Further, the electronic device 14 in the present embodiment is obtained by bonding a silicon single crystal substrate including a plurality of regions which are the sealing plate 33 and a silicon single crystal substrate including a plurality of regions which are the pressure chamber substrate 29 on which the vibration plate 31 and the piezoelectric element 32 are stacked, and dicing the bonded substrates into individual pieces.

FIGS. 6 and 7 are schematic views illustrating the manufacturing process of the electronic device 14, and illustrate the configuration of a vicinity of the bump electrode 40 and the bonding resin 43 which are bonded to the individual electrode wiring 44. First, the piezoelectric element 32 is formed, for example, by stacking the vibration plate 31 on the surface (the surface bonded to the sealing plate 33) of the pressure chamber substrate 29, and sequentially stacking and patterning the lower electrode layer 37, the piezoelectric layer 38, and the upper electrode layer 39 on the vibration plate 31.

Figure 6A:
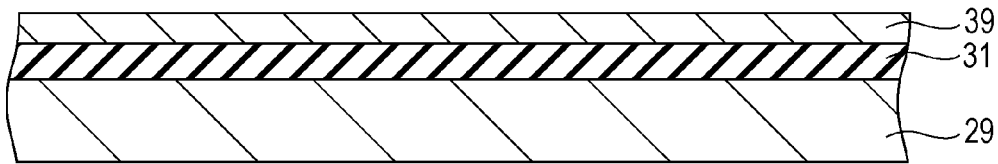
FIG. 6A is a schematic diagram illustrating a manufacturing process of the electronic device.
Figure 6B:
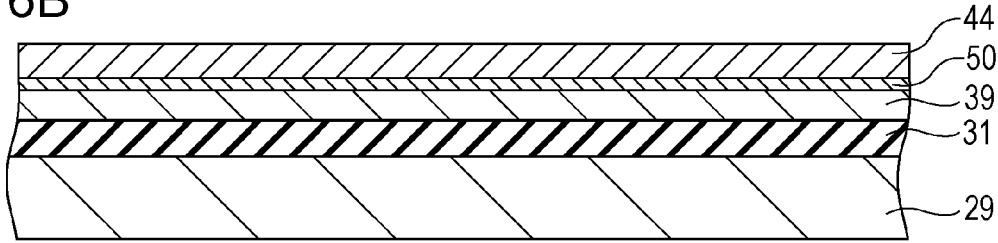
FIG. 6B is a schematic diagram illustrating a manufacturing process of the electronic device.
Figure 6C:
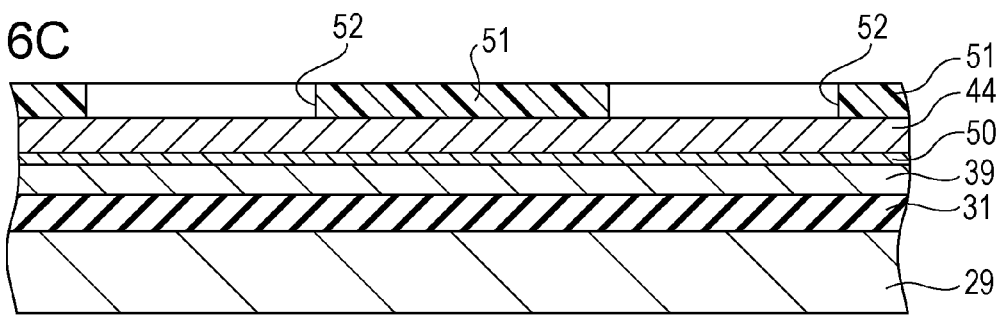
FIG. 6C is a schematic diagram illustrating a manufacturing process of the electronic device.
Figure 6D:
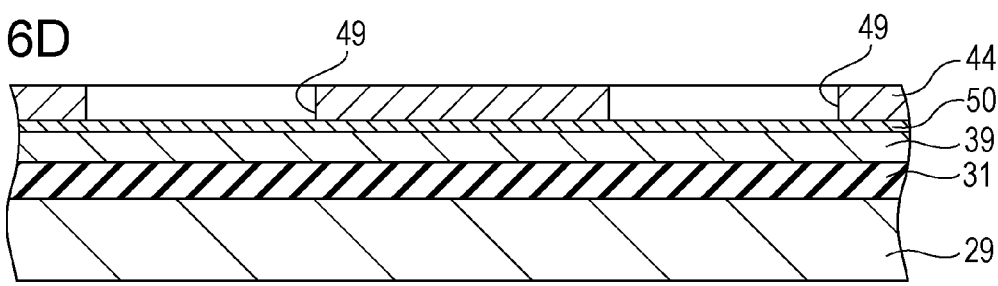
FIG. 6D is a schematic diagram illustrating a manufacturing process of the electronic device.

Here, in a state where the upper electrode layer 39 and the lower electrode layer 37 are formed on the non-drive region as illustrated in FIG. 6A, an adhesion layer 50 (a NiCr layer) and wiring metal (a Au layer) of the electrode wirings 44 and 45 are sequentially deposited, as illustrated in FIG. 6B. Subsequently, the adhesion layer 50 and the electrode wirings 44 and 45 are patterned into a predetermined shape. A removed portion 49 is formed during the patterning. Specifically, as illustrated in FIG. 6C, a resist layer 51 is formed on the Au layer of the electrode wirings 44 and 45, through resist coating, exposure through a mask, and development. An opening 52 is formed in a portion corresponding to the removed portion 49 in the resist layer 51. Then, the electrode wirings 44 and 45, and the adhesion layer 50 are pattered, by using wet etching with an etching solution (or aqua regia-based solution or NaCN-based solution) containing, for example, potassium iodide for the Au layer of the electrode wirings 44 and 45, and wet etching with an etching solution containing, for example, cerium nitrate ammonium for the adhesion layer 50. Thus, as illustrated in FIG. 6D, the Au layer in the portion corresponding to the removed portion 49 is removed, and the adhesion layer 50 is exposed.

Next, a surface treatment is performed by using the organic molecule having a functional group, on the adhesion layer 50 exposed to the removed portion 49. Since the bonding resin 43 in the present embodiment has an epoxy group, a silane coupling agent having an amino group as the organic molecule having a functional group capable of chemically bonding with the bonding resin 43 is used in the surface treatment. Specifically, for example, at the stage where the removed portion 49 is formed, after the silicon single crystal substrate is immersed in a processing solution in which the silane coupling agent is dissolved for a predetermined time, the treatment is performed by drying the silicon single crystal substrate. In this case, the entire surface of the drive substrate including the adhesion layer 50 which is exposed to the removed portion 49 is treated. Further, for example, it is also possible to employ a method of placing a hydroxyl group on the adhesion layer 50 exposed to the removed portion 49 so as to perform binding reaction with the silane coupling agent by using a CVD method. It is possible to increase the binding sites per unit area in the portion, and further increase the adhesive strength for the bonding resin 43, by performing the surface treatment. Further, correspondingly, it is also possible to narrow the dimension W1 in the direction perpendicular to the wiring direction of the adhesion layer 50, and suppress an increase in wiring resistance due to the formation of the removed portion 49.

Through the above process, a plurality of regions which are the drive substrate are formed on the silicon single crystal substrate. Meanwhile, on the silicon single crystal substrate on the sealing plate 33 side, a drive circuit 46 is first formed on the surface bonded to the vibration plate 31 through a semiconductor process. If the drive circuit 46 is formed, the internal resin 41 of the bump electrode 40 is formed on the bonding surface of the sealing plate 33. Specifically, after a material resin (for example a polyimide resin) is coated at a predetermined thickness, the internal resin 41 having a protrusion is patterned in a predetermined position, through a pre-baking process, a photolithography process, and an etching process. If the internal resin 41 is formed, after the adhesion layer 48, the wiring layer 47, and metal which is the conductive film 42 of the bump electrode 40 are deposited, the adhesion layer 48, the wiring layer 47, and the conductive film 42 are formed through the photolithography process and the etching process. Thus, a plurality of regions which are the sealing plate 33 are formed on the silicon single crystal substrate. Further, in the same manner as the removed portion 49 of the electrode wirings 44 and 45, the removed portion 47a is also formed on the wiring layer 47, and it becomes a state where the adhesion layer 48 is exposed in the part.

Figure 6E:
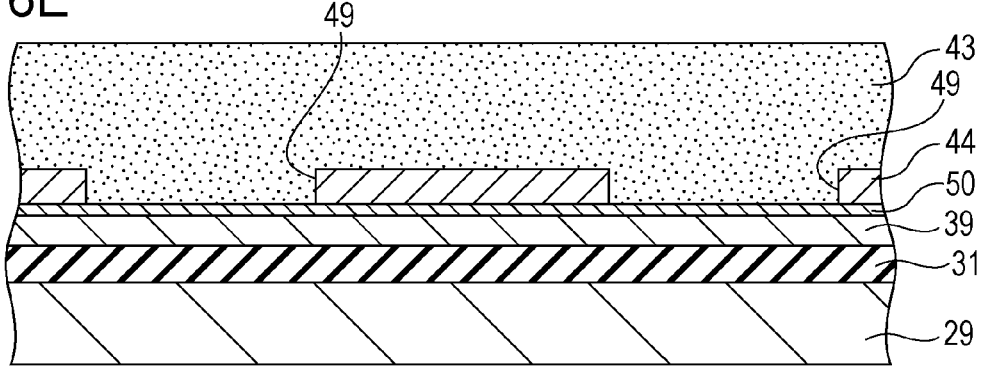
FIG. 6E is a schematic diagram illustrating a manufacturing process of the electronic device.

Next, a process proceeds to a bonding process of the silicon single crystal substrate on the drive substrate (the pressure chamber substrate 29 and the vibration plate 31) side and the silicon single crystal substrate on the sealing plate 33 side. Any one bonding surface of the surface (the bonding surface on the sealing plate 33 side) of the vibration plate 31 stacked on the pressure chamber substrate 29 and the surface (the bonding surface on the vibration plate 31 side) of the sealing plate 33 is coated with the bonding resin 43 (photosensitive resin coating process). In the present embodiment, as illustrated in FIG. 6E, the vibration plate 31 of the drive substrate is coated with the bonding resin 43 by spin coating, while covering the structures such as the electrode wirings 44 and 45 and the piezoelectric element 32. Here, the bonding resin 43 enters the removed portion 49 of the electrode wirings 44 and 45, and is stacked on the adhesion layer 50.

Figure 7A:
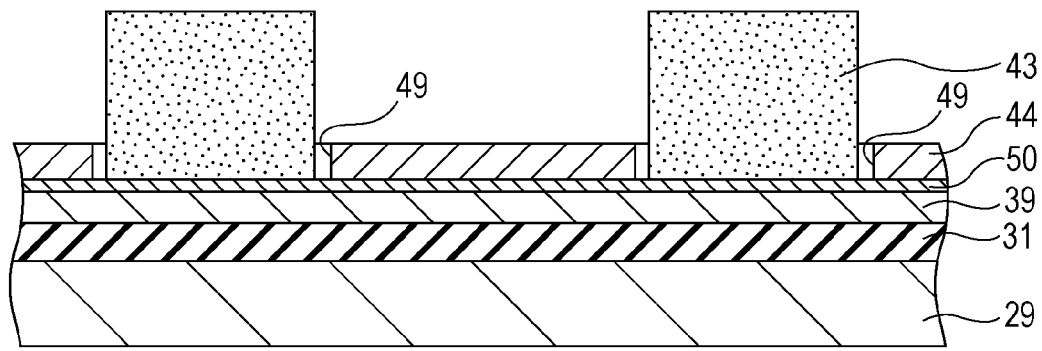
FIG. 7A is a schematic diagram illustrating a manufacturing process of the electronic device.
Figure 7B:
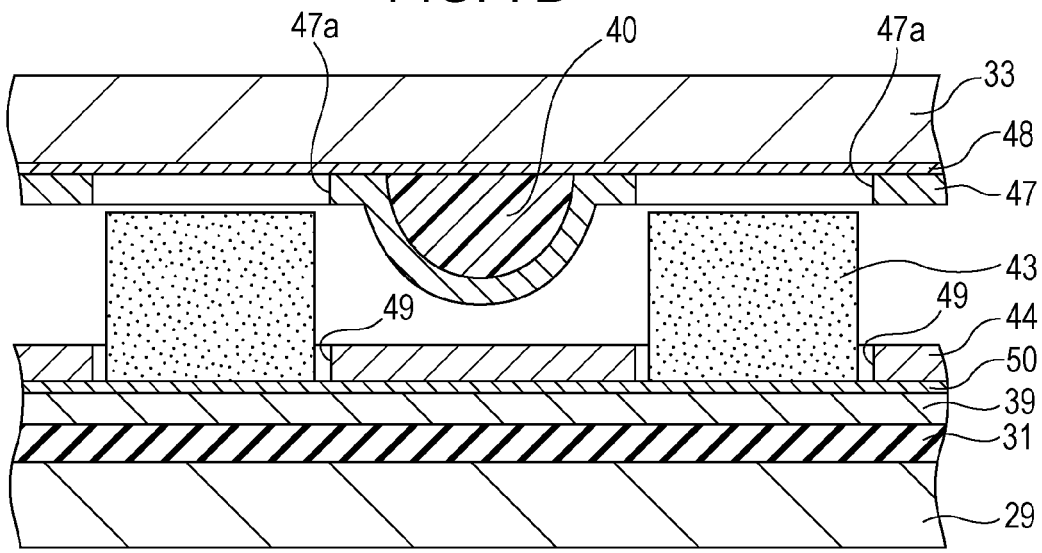
FIG. 7B is a schematic diagram illustrating a manufacturing process of the electronic device.
Figure 7C:
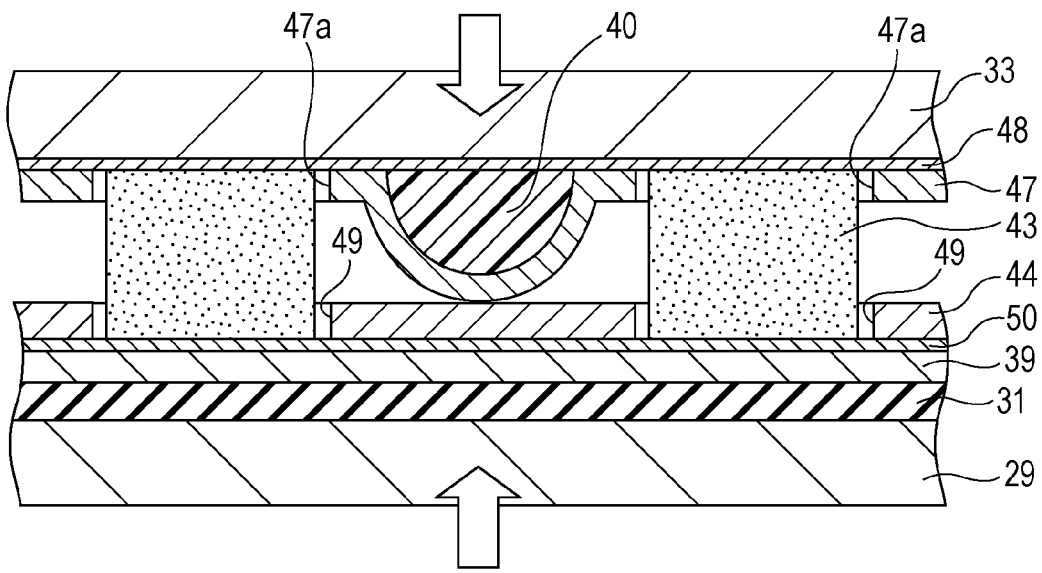
FIG. 7C is a schematic diagram illustrating a manufacturing process of the electronic device.

If the bonding resin 43 is applied, subsequently, after being exposed through a mask of a predetermined pattern, the bonding resin 43 is provisionally cured through a heating process (provisional curing process). Alternatively, after the bonding resin 43 is applied, exposure may also be performed after the heating process. In the provisional curing process, the curing degree of the bonding resin 43 is adjusted based on the exposure amount at the time of exposure or the heating amount at the time of heating. Subsequently, as illustrated in FIG. 7A, development is performed, and the bonding resin 43 is patterned into a predetermined shape at a predetermined position (patterning process). If the bonding resin 43 is patterned, both silicon single crystal substrates are bonded (bonding process). Specifically, as illustrated in FIG. 7B, in a state where the relative positions between both silicon single crystal substrates are aligned, any one silicon single crystal substrate is relatively moved towards the other silicon single crystal substrate side, structures such as the bump electrode 40, the piezoelectric element 32, and the electrode wirings 44 and 45, and the bonding resin 43 are sandwiched between both silicon single crystal substrates and stacked thereon. In this state, as illustrated in FIG. 7C, both silicon single crystal substrates are pressed in the vertical direction while resisting the elastic restoring force of the bump electrode 40. Both substrates are bonded by the bonding resin 43 at a state where the bump electrodes 40 are electrically connected to the lower electrode layer 37 and the upper electrode layer 39 in the non-drive region. At this time, the bonding resin 43 overlapping the electrode wirings 44 and 45 and wiring layer 47 is adhered to the adhesion layers 48 and 50 of the removed portions 47a and 49.

If both silicon single crystal substrates are bonded, the pressure chamber 30 is formed by performing a lapping process, a photolithography process, and an etching process on the silicon single crystal substrate on the pressure chamber substrate 29 side. Finally, the silicon single crystal substrate is scribed along a predetermined scribing line, and is cut and divided into individual electronic devices 14. Further, the present embodiment illustrates a configuration in which two sheets of silicon single crystal substrates are bonded and then diced into individual pieces, but the present invention is not limited thereto. For example, the sealing plate and the flow path substrate may be bonded after being respectively diced into individual pieces.

Then, the electronic device 14 which is manufactured by the above process is positioned and fixed in the flow path unit 15 (flow path substrate 28) by using the adhesive or the like. The recording head 3 is manufactured by bonding the head case 16 and the flow path unit 15, at a state in which the electronic device 14 is accommodated in the accommodating space 17 of the head case 16.

In this way, in the portion where the bonding resin 43 is bonded to the electrode wirings 44 and 45 and the wiring layer 47, Au is removed in region including the portion, and the bonding resins 43 are respectively bonded to the adhesion layers 48 and 50 that are exposed to these removed portions 47a and 49, it is possible to secure the bonding strength between the substrates by the bonding resin 43, and to further improve the adhesion reliability. In particular, the present invention is suitable for a configuration in which a wiring made of metal mainly composed of Au is formed at a higher density on the substrate.

Figure 8A:
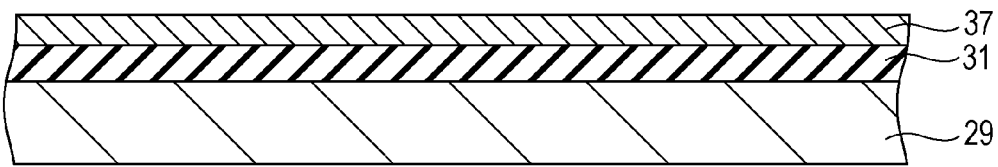
FIG. 8A is a schematic diagram illustrating a manufacturing process of an electronic device according to a second embodiment.
Figure 8B:
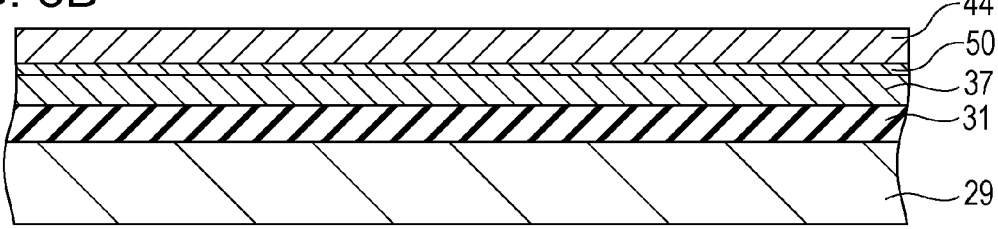
FIG. 8B is a schematic diagram illustrating a manufacturing process of an electronic device according to a second embodiment.
Figure 8C:
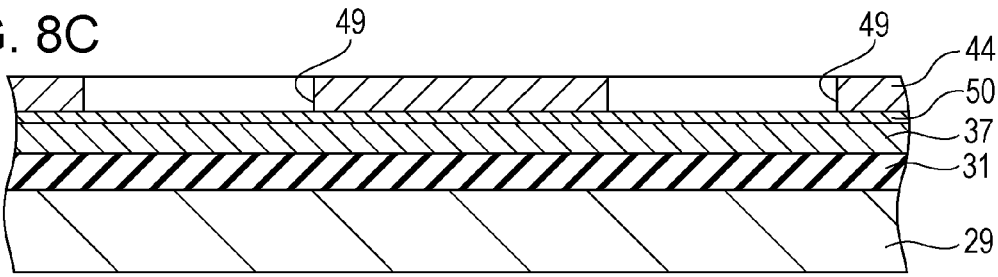
FIG. 8C is a schematic diagram illustrating a manufacturing process of an electronic device according to a second embodiment.
Figure 8D:
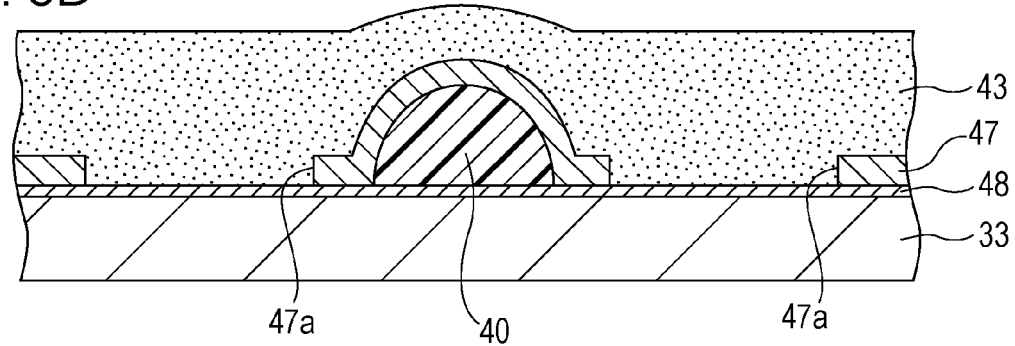
FIG. 8D is a schematic diagram illustrating a manufacturing process of an electronic device according to a second embodiment.
Figure 8E:
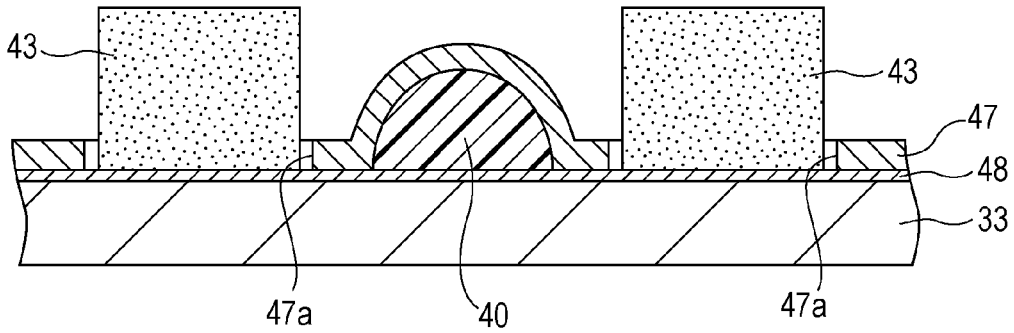
FIG. 8E is a schematic diagram illustrating a manufacturing process of an electronic device according to a second embodiment.
Figure 9A:
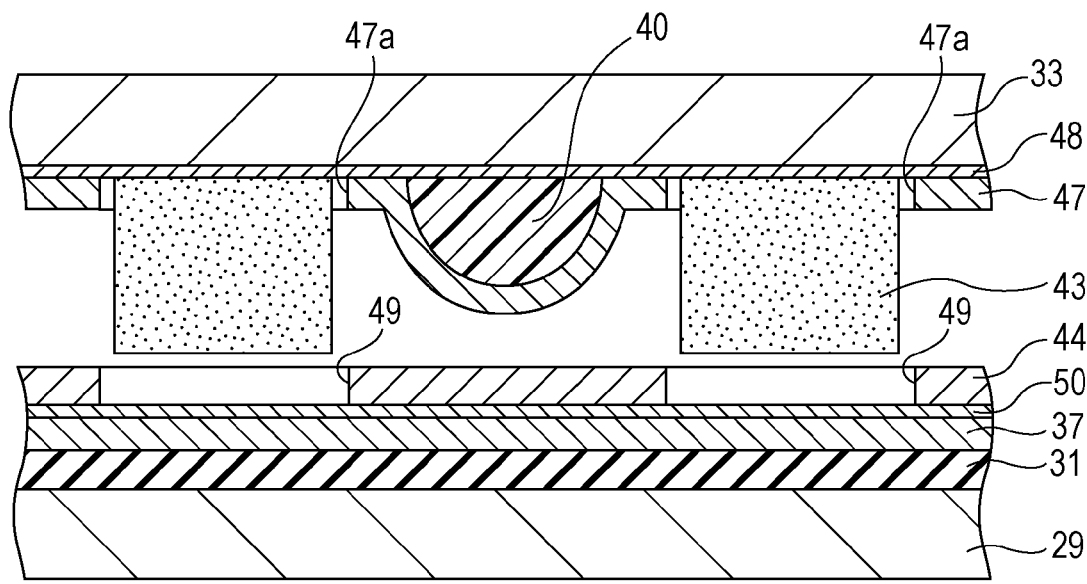
FIG. 9A is a schematic diagram illustrating a manufacturing process of the electronic device according to the second embodiment.
Figure 9B:
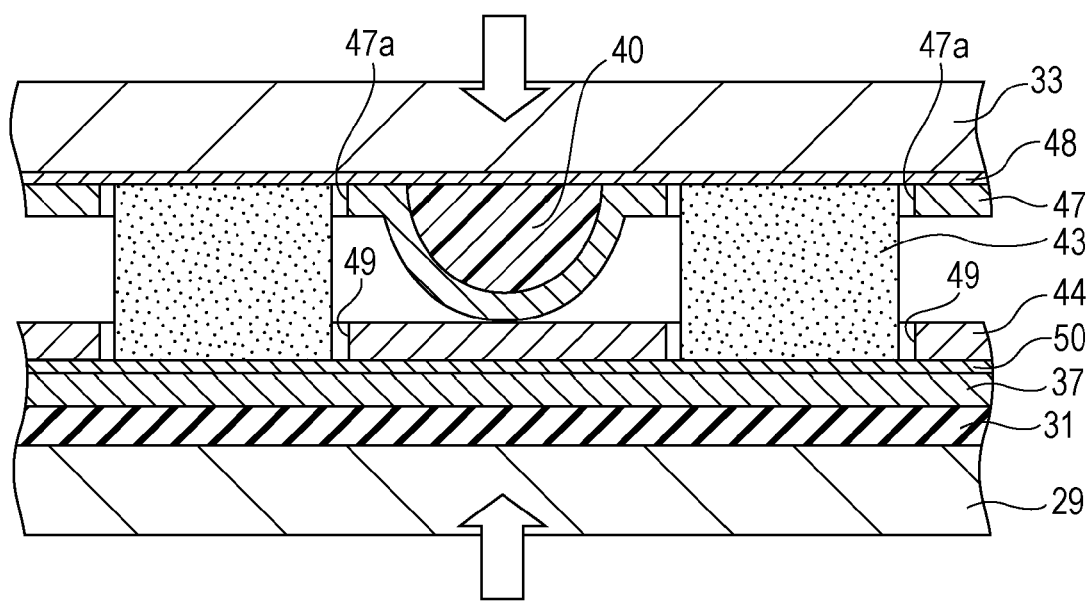
FIG. 9B is a schematic diagram illustrating a manufacturing process of the electronic device according to the second embodiment.

FIGS. 8A to 8E and FIGS. 9A and 9B are schematic diagrams illustrating manufacturing processes of an electronic device 14 in a second embodiment of the present invention. While the same process as in the first embodiment is performed until the removed portion 49 is formed on the electrode wirings 44 and 45 in the present embodiment (FIG. 8A to FIG. 8C), the present embodiment is different from the first embodiment in that the silicon single crystal substrate on the sealing plate 33 side is coated with the bonding resin 43, as illustrated in FIG. 8D. In other words, the surface on the drive substrate side of the sealing plate 33 is coated with the bonding resin 43 while covering the structure such as a wiring layer 47 and a drive circuit. In this case, the bonding resin 43 enters the removed portion 47a of the wiring layer 47, and is also stacked on the adhesion layer 48. The bonding resin 43 applied to the silicon single crystal substrate on the sealing plate 33 side is patterned into a predetermined shape at a predetermined position through exposure, heating and development, as illustrated in FIG. 8E. If the bonding resin 43 is patterned, as illustrated in FIG. 9A, both silicon single crystal substrates are stacked in a state where the relative positions thereof are aligned. Here, the bonding resin 43 disposed on the electrode wirings 44 and 45 is adhered to the adhesion layer 50 in the removed portion 49, and both substrate are bonded. Even in this configuration, in the same manner as the first embodiment, since the bonding resins 43 are respectively bonded to the adhesion layers 48 and 50 that are exposed to the removed portions 47a and 49, it is possible to secure the bonding strength between the substrates by the bonding resin 43, and to further improve the adhesion reliability. In addition, since the other configuration is the same as the above-mentioned embodiment, the description thereof will be omitted.

It should be noted that, an adhesive having photosensitivity is illustrated as the bonding resin 43 which is bonded to the electrode wirings 44 and 45 and the wiring layer 47, but without being limited thereto, it is possible to adopt various resins, as long as the resins are capable of bonding substrates to each other (the drive substrate and the stacked body).

Further, in the above description, an ink jet recording head mounted on an ink jet printer is exemplified as a liquid ejecting head, but can also be applied to those that eject liquid other than ink. For example, it is possible to apply the present invention to a color material ejecting head used for manufacturing color filters such as a liquid crystal display; an electrode material ejecting head used for electrode formation for an organic electro luminescence (EL) display, a surface emission display (FED), and the like; a bio-organic material ejecting head used for manufacturing biochips (biochemical elements).

Furthermore, the utilization of the present invention is not limited to an electronic device used as an actuator for a liquid ejecting head, and for example, the present invention can also be applied to electronic devices or the like used for various sensors and the like.

The present application claims priority to Japanese Patent Application No. 2015-057122 filed on Mar. 20, 2015, which is hereby incorporated by reference in its entirety.

What is claimed is:

1. An electronic device comprising:
    a drive substrate including a drive element and a wiring related to driving of the drive element, which are formed thereon; and
    a stacked body that is formed and spaced from the drive substrate, by interposing the drive element, the wiring, and a bonding resin therebetween,
    wherein the wiring is made of wiring metal containing gold (Au) on the drive substrate through a base layer, and
    wherein a portion of the base layer is exposed by removing a portion of the wiring metal, and the exposed base layer includes a portion covered with the bonding resin, and a portion that is not covered with the bonding resin.

2. The electronic device according to claim 1,
    wherein a wiring metal removal region, which is a portion of the base layer including the portion covered with the bonding resin and a portion that is not covered with the bonding resin, is surrounded by the wiring metal in a plan view.

3. The electronic device according to claim 1,
    wherein a dimension in a wiring direction of the wiring metal removal region is greater than a width in the wiring direction of a portion in which the bonding resin is bonded to the base layer.

4. The electronic device according to claim 1,
    wherein the wiring metal removal region is subjected to a surface treatment by an organic molecule having a functional group that is chemically bonded to the bonding resin.

5. The electronic device according to claim 4,
    wherein the bonding resin has an epoxy group, and the organic molecule has an amino group.

6. The electronic device according to claim 1,
    wherein the base layer is made of metal different from Au.

7. A manufacturing method of an electronic device, the electronic device including a drive substrate including a drive element and a wiring related to driving of the drive element, which are formed thereon, and a stacked body that is formed and spaced from the drive substrate, by interposing the drive element, the wiring, and a bonding resin therebetween, the manufacturing method comprising:
    forming a base layer on the drive substrate;
    forming a wiring by superimposing and forming wiring metal containing gold (Au) on the base layer;
    exposing the base layer by removing a portion of the wiring metal; and
    bonding the drive substrate and the stacked body, in a state where a bonding resin is bonded to a portion in which the base layer is exposed, by interposing the bonding resin between the drive substrate and the stacked body.

* * * * *